(12) United States Patent
Pangrle et al.

(10) Patent No.: US 8,089,113 B2
(45) Date of Patent: Jan. 3, 2012

(54) DAMASCENE METAL-INSULATOR-METAL (MIM) DEVICE

(75) Inventors: Suzette K. Pangrle, Cupertino, CA (US); Steven Avanzino, Cupertino, CA (US); Sameer Haddad, San Jose, CA (US); Michael VanBuskirk, Saratoga, CA (US); Manuj Rathor, Milpitas, CA (US); James Xie, San Jose, CA (US); Kevin Song, Santa Clara, CA (US); Christie Marrian, San Jose, CA (US); Bryan Choo, Mountain View, CA (US); Fei Wang, San Jose, CA (US); Jeffrey A. Shields, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 632 days.

(21) Appl. No.: 11/633,929

(22) Filed: Dec. 5, 2006

(65) Prior Publication Data

US 2008/0132068 A1 Jun. 5, 2008

(51) Int. Cl.
*H01L 29/94* (2006.01)
*H01L 27/108* (2006.01)

(52) U.S. Cl. ........ 257/310; 257/295; 257/296; 257/306; 257/532; 257/E21.272; 257/E21.648; 438/253; 438/393; 438/396; 438/644; 438/654

(58) Field of Classification Search ................ 257/295, 257/296, 306, 310, 532, E21.272, E21.648; 438/253, 393, 396, 644, 654, 957
See application file for complete search history.

(56) References Cited

U.S. PATENT DOCUMENTS

| | | | |
|---|---|---|---|
| 5,122,477 A * | 6/1992 | Wolters et al. | 438/3 |
| 6,215,646 B1 * | 4/2001 | Ochiai et al. | 361/301.4 |
| 2003/0040154 A1 * | 2/2003 | Durcan et al. | 438/246 |
| 2005/0118780 A1 * | 6/2005 | Balakumar et al. | 438/396 |
| 2006/0197183 A1 * | 9/2006 | Yang et al. | 257/532 |
| 2006/0223276 A1 * | 10/2006 | Lin et al. | 438/393 |
| 2006/0267019 A1 * | 11/2006 | Kim et al. | 257/68 |

* cited by examiner

*Primary Examiner* — Asok Sarkar

(57) ABSTRACT

The present method of fabricating a memory device includes the steps of providing a dielectric layer, providing an opening in the dielectric layer, providing a first conductive body in the opening in the dielectric layer, providing a switching body in the opening, and providing a second conductive body in the opening.

20 Claims, 7 Drawing Sheets

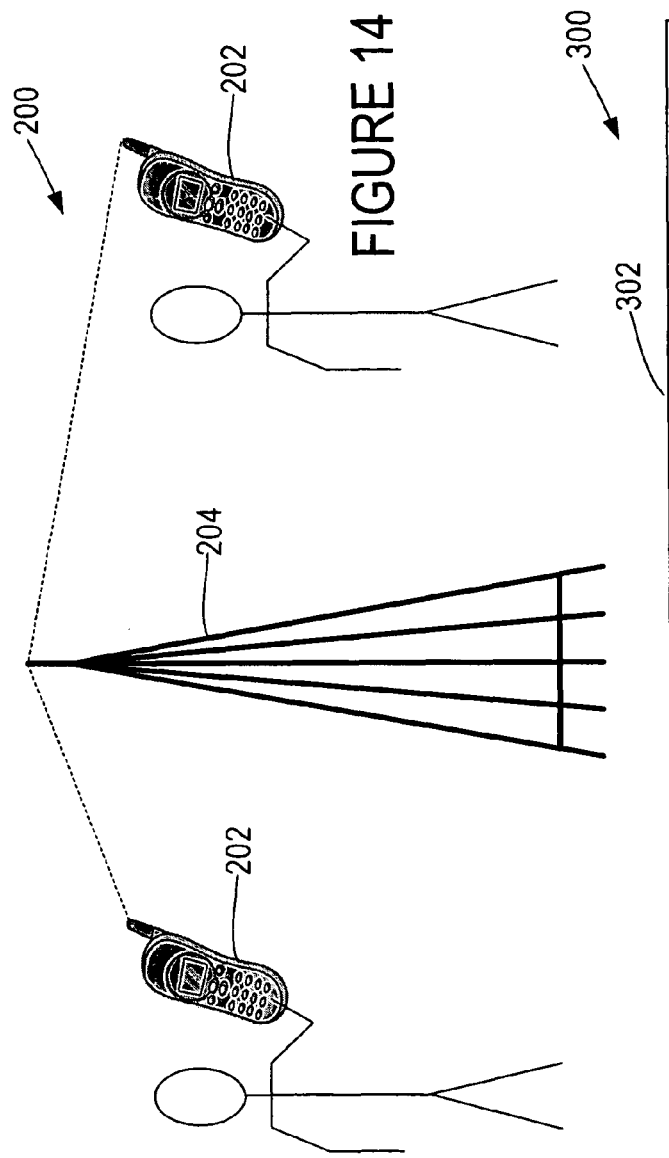
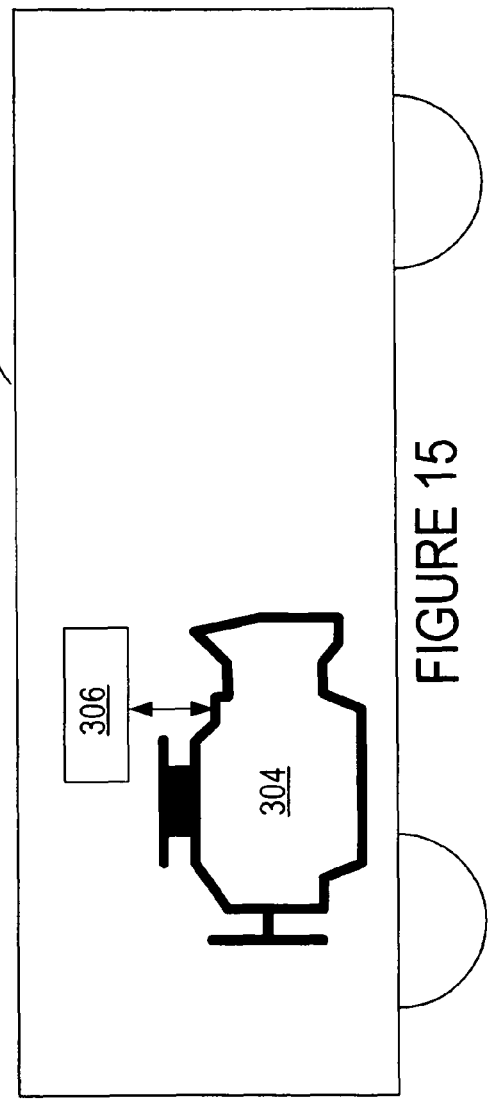

DAMASCENE METAL-INSULATOR-METAL (MIM) DEVICE

BACKGROUND OF THE INVENTION

1. Technical Field

This invention relates generally to memory devices, and more particularly, to Metal-Insulator-Metal (MIM) devices and methods of fabrication thereof.

2. Background Art

FIGS. 1 and 2 illustrate a method of fabricating a Metal-Insulator-Metal (MIM) device using etching techniques. Initially, conductive layer 22 is provided on a substrate 20. Next, an insulating layer 24 is provided on the conductive layer 22. Then, another conductive layer 26 is provided on the insulating layer 24. It will be understood that the conductive layers 22, 26 and insulating layer 24 may be of a variety of materials. (It is further understood that the term "MIM" is used to describe such a device even though, for example, the top and/or bottom layers 22, 26 may be nonmetallic). Next, a photoresist layer 28 is provided over the conductive layer 26 and, using standard photolithographic techniques, the photoresist layer 28 is patterned as shown. Using the patterned photoresist layer 28 as a mask, the exposed material is etched away to remove portions of the conductive layer 22, insulating layer 24, and conductive layer 26, to form the remaining MIM stack 30 on the substrate 20. The photoresist 28 is then removed, resulting in the MIM device 30 including electrode 22A, switching layer 24A, and electrode 26A formed on the substrate 20.

It will be understood that the device stack must be properly formed to ensure proper operation of the device 30. For example, is highly desirable that the etchant provide proper, even etching of the materials of the electrodes 22, 26 and insulating layer 24, meanwhile leaving the exposed material of the substrate 20 substantially intact (the "selectivity" of the etchant refers to the ability to properly remove selected material while leaving other material in contact therewith substantially intact). While the MIM device 30 of FIG. 2 is shown at ideally formed, it has occurred that, depending on the materials selected for the electrodes 22, 26 and insulating layer 24, and the etchant used, uneven etching of the materials of the layers 22, 24, 26 can take place, resulting in improper formation of the MIM stack 30 (for example one layer may etch more rapidly than the other layers, resulting in a larger amount of that layer being etched away than the other layers (FIG. 3). In addition, undesirable gouging of the substrate 20 and layers 22, 24, 26 may take place. These phenomena cause degradation in performance in the resulting memory device.

Therefore, what is needed is an approach which avoids the above-cited problems, providing a properly and consistently formed MIM device.

DISCLOSURE OF THE INVENTION

Broadly stated, the present method of fabricating a memory device includes the steps of providing a dielectric layer, providing an opening in the dielectric layer, providing a first conductive body in the opening, providing a switching body in the opening, and providing a second conductive body in the opening.

The present invention is better understood upon consideration of the detailed description below, in conjunction with the accompanying drawings. As will become readily apparent to those skilled in the art from the following description, there are shown and described embodiments of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of illustrative embodiments when read in conjunction with the accompanying drawings, wherein:

FIGS. 14-16 are systems incorporating memory devices of the present type.

BEST MODE(S) FOR CARRYING OUT THE INVENTION

Reference is now made in detail to specific embodiments of the present invention which illustrate the best mode presently contemplated by the inventors for practicing the invention.

Figure 1:
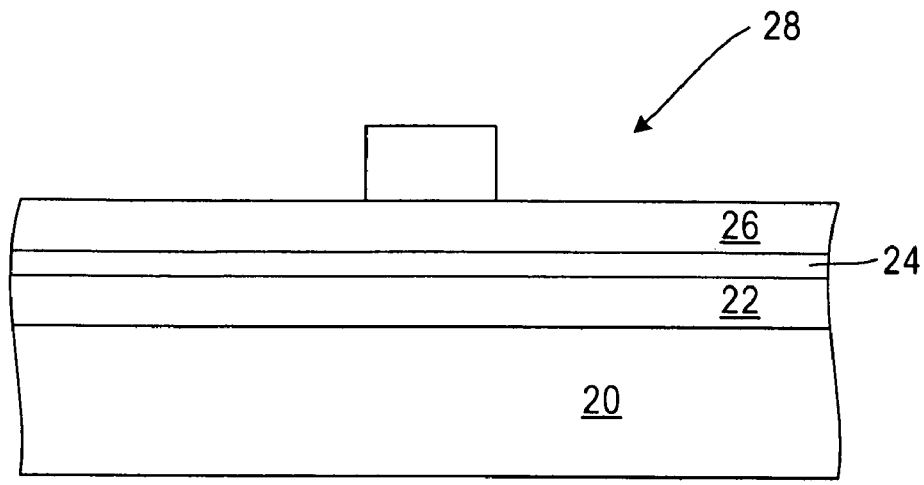
FIGS. 1-3 illustrate process steps in the formation of a MIM in accordance with a method of the prior art.
Figure 2:
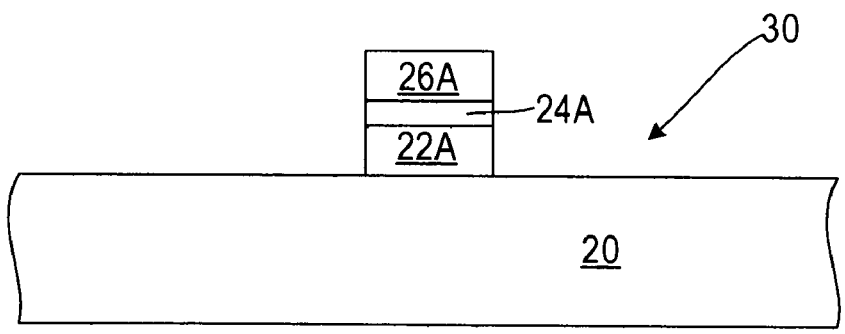
Figure 3:
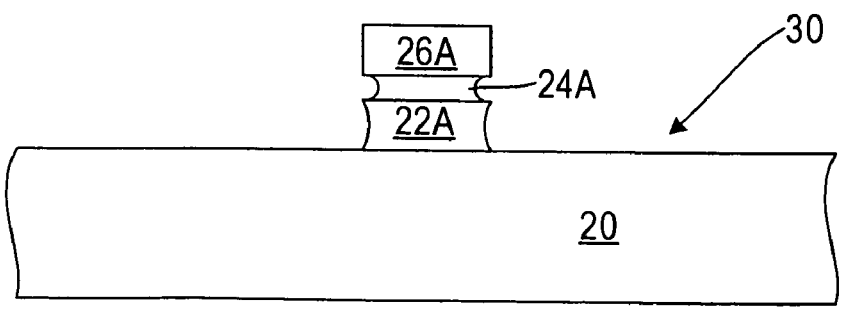
Figure 4:
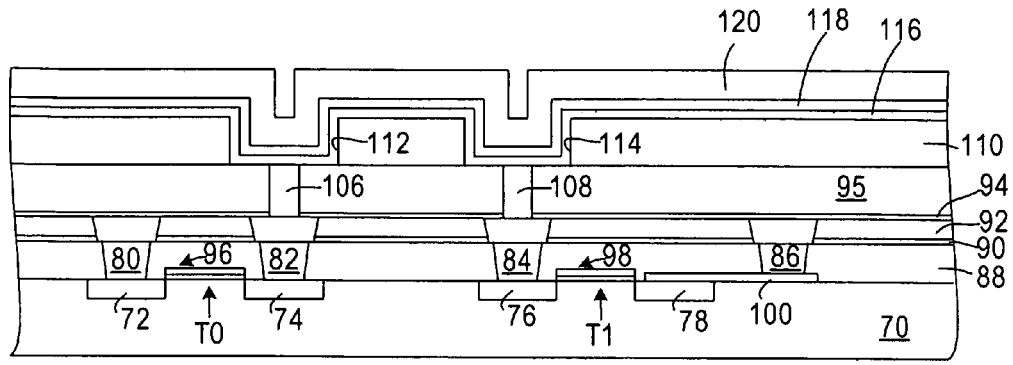
FIGS. 4-6 illustrate process steps in the formation of a first embodiment of MIM device in accordance with the present invention.

With reference to FIG. 4, the structure formed on a semiconductor wafer includes a p+ semiconductor substrate 70 having n+ regions 72, 74, 76, 78 formed therein. In contact with the respective n+ regions 72, 74, 76, 78 are conductive W plugs 80, 82, 84, 86 which extend through $SiO_2$ layer 88, SiN layer 90, and $SiO_2$ layer 92. Overlying the $SiO_2$ layer 92 and the tops of the W plugs 80, 82, 84, 86 is a SiN layer 94. The n+ regions 72, 74, along with gate and gate oxide 96, form transistor T0, and the n+ regions 76, 78, along with gate and gate oxide 98, form transistor T1. The plug 80 contacts the n+ source region 72 of the transistor T0, while the plug 82 contacts the n+ drain region 74 of the transistor T0. The plug 84 contacts the n+ drain region 76 of the transistor T1, while the plug 86, through W body 100 on the substrate 70, contacts the n+ source region 78 of the transistor T1. Conductive W plugs 106, 108 contact the respective plugs 82, 84 and extend through SiN layer 94 and an $SiO_2$ layer 95.

A nitride, for example SiN or SiON layer or a bilayer of SiN/SiON 110 is provided over the resulting structure, to a thickness of for example 1000 angstroms, with a preferred range of 300-5000 angstroms thickness. Using standard photolithographic techniques, openings 112, 114 are provided through the nitride layer 110 over the respective plugs 106, 108 so as to expose those plugs 106, 108. A conductive layer 116 is deposited over the resulting structure, on the nitride layer 110 and in the openings 112, 114 to contact the plugs 106, 108. The conductive layer 116 may for example be Ta, TaN, Ti, TiTiN, W, WN, Ni, Co, Al, Cu or any other suitable material. This deposition may be undertaken by for example PVD, ALD, CVD, PECVD or MOCVD. A layer of switching material 118 is deposited or grown on the conductive layer 116, extending into the openings 112, 114 in the nitride layer 110. This layer 118 is an insulator, for example Ta oxide of various stoichiometries, Ti oxide of various stoichiometries, V oxide of various stoichiometries, Cu oxide of various stoichiometries, Ni oxide of various stoichiometries, Ni oxide of various stoichiometries, Co oxide of various stoichiometries, or any other suitable material. The layer 118 may be formed thermally, or may be formed by PVD, sputtering, reactive sputtering, CVD, PECVD, MOCVD, or a similar process. A conductive layer 120 is deposited on the layer 118, extending into the openings 112, 114 in the nitride layer 110. The conductive layer 120 may for example be Ta, TaN, Ti, TiTiN, W, WN, Ni, Co, Al, Cu or any other suitable material. Deposition may be undertaken by for example PVD, ALD, CVD, PECVD or MOCVD.

Figure 5:
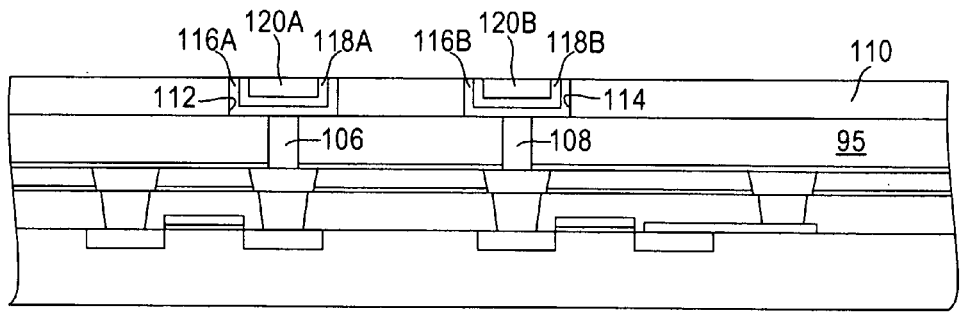

A chemical-mechanical polishing step is undertaken to form the structure of FIG. 5, wherein the portions of the layers 116, 118, 120 overlying the nitride layer 110, i.e., the overburden, are removed and the nitride 110 itself is exposed. The nitride layer 110 (and other exposed structure) is overpolished by 300 angstroms. With a standard deviation of +/−200 angstroms in the surface of the nitride layer 110 after polishing, the resulting thickness of the nitride layer 110 would be in the range of 500-900 angstroms. This polishing step leaves portions of the layers 116, 118, 120 in the openings. These remaining portions are conductive body 116A in contact with plug 106, switching body 118A in contact with conductive body 116A, and conductive body 120A in contact with switching body 118A, all disposed within the opening 112, and conductive body 116B in contact with plug 108, switching body 118B in contact with conductive body 116B, and conductive body 120B in contact with switching body 118B, all disposed within the opening 114.

Figure 6:
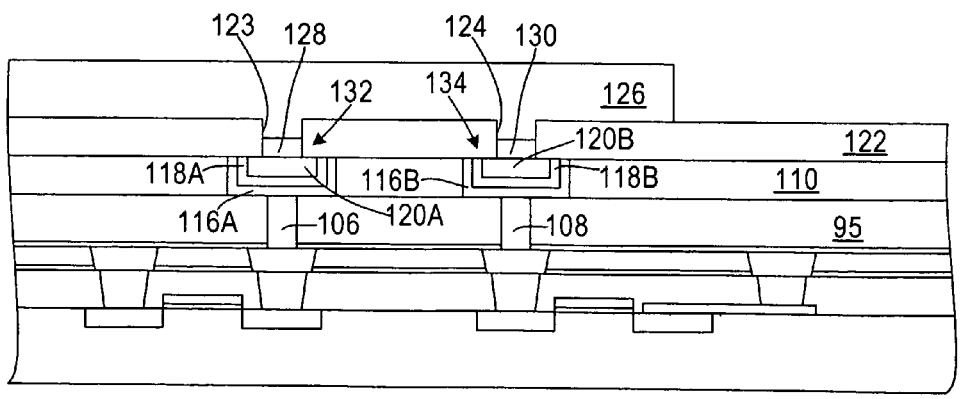

Referring to FIG. 6, an encapsulating dielectric layer 122, for example SiN, SiC, or a bilayer of SiN/SiON, SiC/SiN, or SiC/SiON, is deposited on the resulting structure. An oxidative pretreatment may be undertaken prior to his deposition to improve adhesion and form an insulating layer across the common surface. Using standard photolithographic techniques, openings 123, 124 are provided in the layer 122 to expose the conductive bodies 120A, 120B. A conductive metal layer 126 is deposited on the resulting structure, connected to the conductive bodies 120A, 120B by conductive Ti/TiN glue layers 128, 130.

The conductive body 116A (electrode), switching body 118A, and conductive body 120A (electrode) form a metal-insulator-metal (MIM) memory device 132 within the opening 112, filling the opening 112. Likewise, the conductive body 116B (electrode), switching body 118B, and conductive body 120B (electrode) form a metal-insulator-metal (MIM) memory device 134 within the opening 114, filling the opening 114. The present approach is therefore a damascene process wherein elements are provided in trenches and chemical-mechanical planarization processes are undertaken thereon. As will be seen, using this approach, etching to form the MIM device is not used, avoiding the problems described above. Rather, a highly efficient and simple approach as presently described is used.

Figure 7:
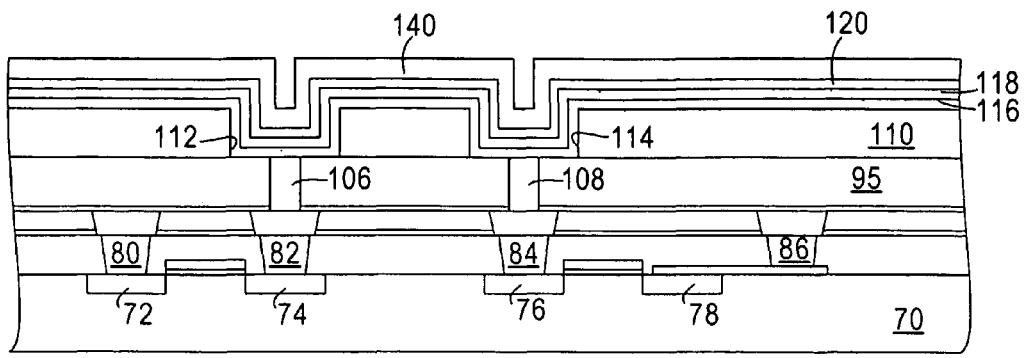
FIGS. 7-9 illustrate process steps in the formation of a second embodiment of MIM device in accordance with the present invention.
Figure 8:
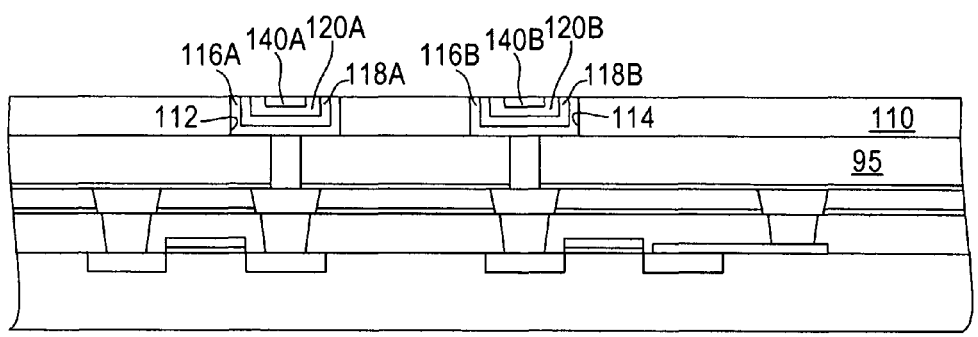

In the embodiment of FIGS. 4-6, the conductive layer 120 is sufficiently thick to provide that after the polishing step the remaining portions of the layers 116, 118, 120 fill the openings 112, 114. In the event that it is appropriate to use a thinner conductive layer 120 due to limitations of thickness or stress of the top layer material, a sacrificial metal layer 140 may be deposited on the thinner conductive layer 120 (FIG. 7) prior to the polishing step, using any of the deposition techniques set forth above. This metal layer 140 is sufficiently thick so that after the polishing step is undertaken (FIG. 8), the remaining conductive body 116A, switching body 118A, conductive body 120A, and metal body 140A (contacting conductive body 120A) fill the opening 112, and the remaining conductive body 116B, switching body 118B, conductive body 120B, and metal body 140B (contacting conductive body 120B) fill the opening 114.

Figure 9:
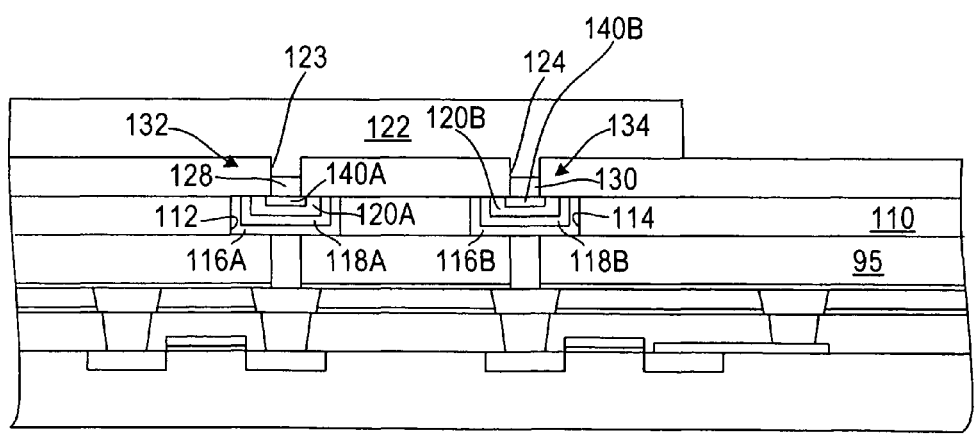

Then (FIG. 9), encapsulating dielectric layer 122 is deposited on the resulting structure, and openings 123, 124 are provided in the layer 122 to expose the metal bodies 140A, 140B. A conductive metal layer 126 is deposited on the resulting structure, connected to the metal bodies 140A, 140B by conductive Ti/TiN glue layers 128, 130.

Figure 10:
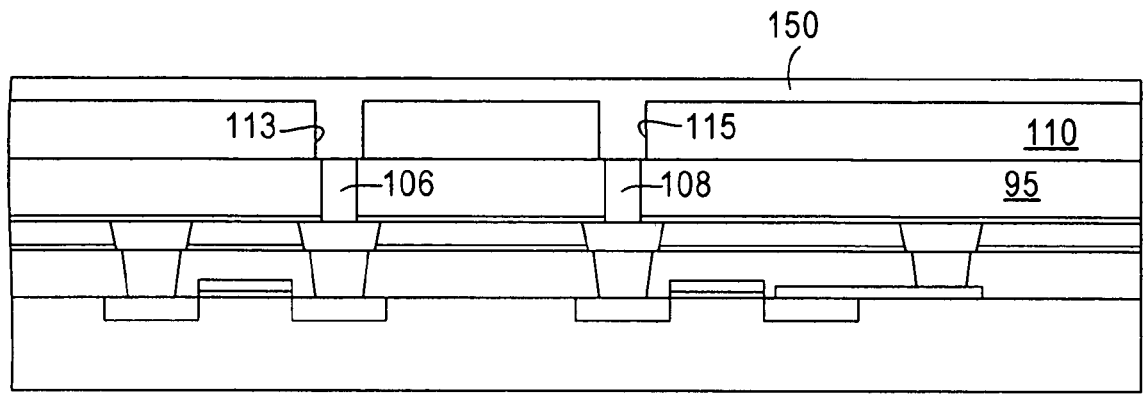
FIGS. 10-13 illustrate process steps in the formation of a third embodiment of MIM device in accordance with the present invention.

FIGS. 10-13 illustrate a third embodiment of the invention. With reference to FIG. 10, similar to FIG. 4, a nitride, for example SiN or SiON layer 110 is provided, to a thickness of for example 1000 angstroms. Using standard photolithographic techniques, openings 1113, 115 are provided through the nitride layer 110 over the respective plugs 106, 108 so as to expose those plugs 106, 108. A conductive layer 150 is deposited over the resulting structure, on the nitride layer 110 and in the openings 113, 115 to contact the plugs 106, 108. A chemical-mechanical polishing step is undertaken, wherein portions of the layer 150 overlying the nitride layer 110 are removed and the nitride 110 itself is exposed, and conductive bodies 150A, 150B are formed in the respective openings 113, 115. Next, a nitride layer 152 is deposited on the resulting structure, and openings 154, 156 are provided through the nitride layer 152 over the respective conductive bodies 150A, 150B to expose the conductive bodies 150A, 150B. A layer of switching material 158 is deposited on the resulting structure, extending into the openings 154, 156 in the nitride layer 152 and in contact with the respective conductive bodies 150A, 150B. This layer 158 is an insulator, as described above. Next, a conductive layer 160 is deposited on the layer 158, extending into the openings 154, 156 in the nitride layer 152.

Figure 12:
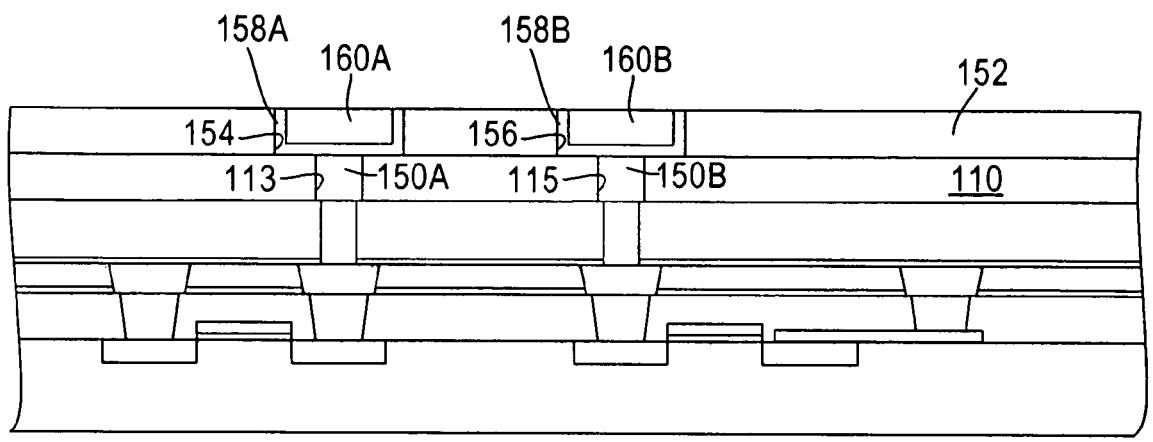

A chemical-mechanical polishing step is undertaken to form the structure of FIG. 12, wherein the portions of the layers 158, 160 overlying the nitride layer 152 are removed and the nitride 152 itself is exposed. This polishing step leaves portions of the layers 158, 160 in the openings 154, 156. These remaining portions are switching body 158A and conductive body 160A in contact with switching body 158A, disposed within the opening 154 (with switching body 158A in contact with conductive body 150A), and switching body 158B and conductive body 160B in contact with switching body 158B, disposed within the opening 156 (with switching body 158B in contact with conductive body 150B).

Then (FIG. 13), encapsulating dielectric layer 122 is deposited on the resulting structure, and openings 123, 124 are provided in the layer 122 to expose the conductive bodies 160A, 160B. A conductive metal layer 126 is deposited on the resulting structure, connected to the conductive bodies 160A, 160B by conductive Ti/TiN glue layers 128, 130.

The conductive body 150A (electrode), switching body 158A, and conductive body 160A (electrode) form a metal-insulator-metal (MIM) memory device 132, with conductive body 150A within opening 113, and with switching body 158A and conductive body 160A within opening 154. Likewise, the conductive body 150B (electrode), switching body 158B, and conductive body 160B (electrode) form a metal-insulator-metal (MIM) memory device 134, with conductive body 150B within opening 115, and with switching body 158B and conductive body 160B within opening 156. Similar to the above embodiments, the present approach is a damascene process wherein elements are provided in trenches and chemical-mechanical planarization processes are undertaken thereon.

Figure 11:
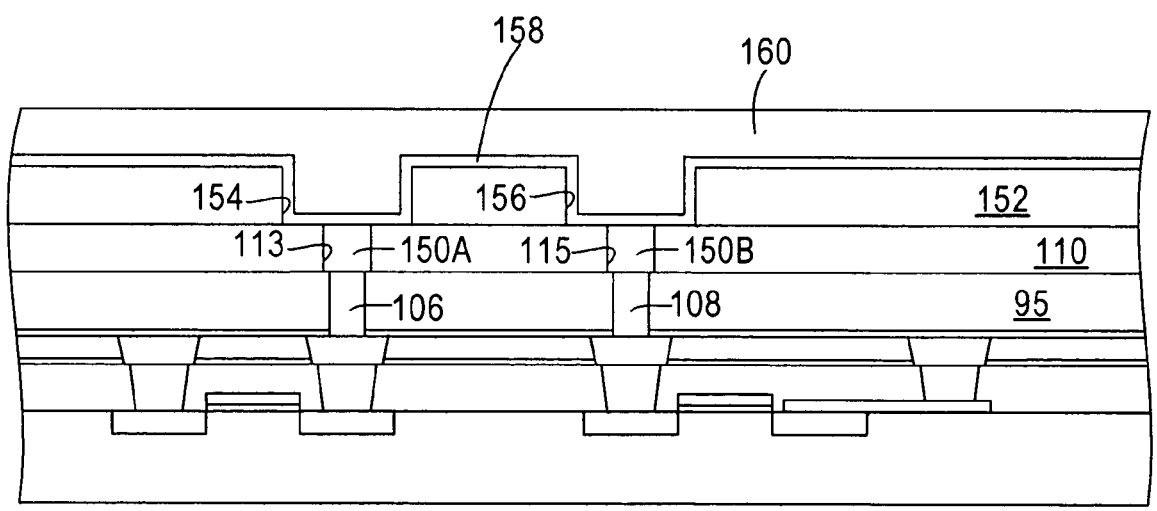
Figure 13:
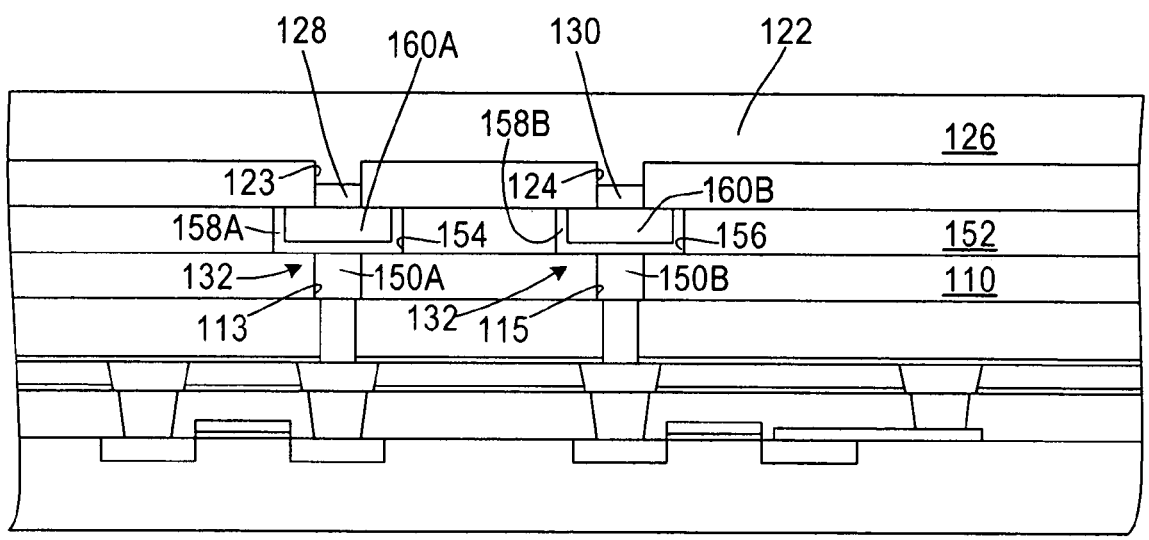

The openings 154, 156 in the layer 152 are formed to fully cover and overlap the respective openings 113, 115 therebelow so as to avoid stress points which may occur when the edge of an opening is formed over the associated opening, which can occur when the openings are misaligned. This possibility is minimized by providing that one of the openings is substantially larger in cross-section than the associated opening, as illustrated in FIGS. 11-13.

FIG. 14 illustrates a system 200 utilizing memory devices as described above. As shown therein, the system 200 includes hand-held devices in the form of cell phones 202, which communicate through an intermediate apparatus such as a tower 204 (shown) and/or a satellite. Signals are provided from one cell phone to the other through the tower 204. Such a cell phone 202 with advantage uses memory devices of the type described above for data storage, for example names, telephone number and other data. One skilled in the art will readily understand the advantage of using such memory devices in other hand-held devices which utilize data storage, such as portable media players, personal digital assistants, digital cameras and the like.

FIG. 15 illustrates another system 300 utilizing memory devices as described above. The system 300 includes a vehicle 302 having an engine 304 controlled by an electronic control unit 306. The electronic control unit 306 with advantage uses memory devices of the type described above for data storage, for example data relating to engine and vehicle operating conditions.

Figure 16:
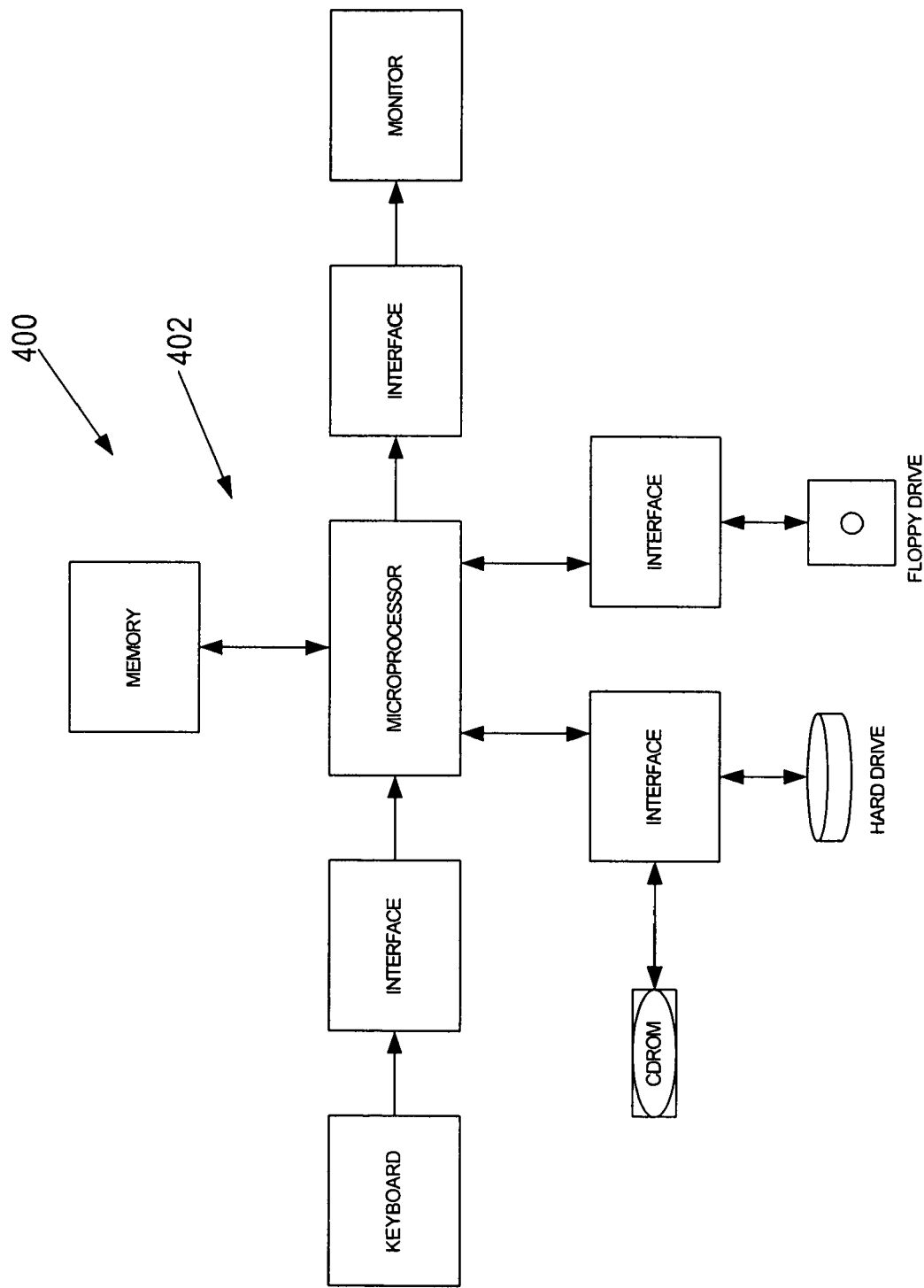

FIG. 16 illustrates yet another system 400 utilizing memory devices as described above. This system 400 is a computer 402 which includes an input in the form of a keyboard, and a microprocessor for receiving signals from the keyboard through an interface. The microprocessor also communicates with a CDROM drive, a hard drive, and a floppy drive through interfaces. Output from the microprocessor is provided to a monitor through an interface. Also connected to and communicating with the microprocessor is memory which may take the form of ROM, RAM, flash and/or other forms of memory. The memory with advantage uses memory devices of the type described above for storage of any data which is of use.

It will be seen to herein as provided an approach for formation of MIM devices using damascene processes. The present approach clearly overcomes the problems set forth above.

The foregoing description of the embodiments of the invention has been presented for purposes of illustration and description. It is not intended to be exhaustive or to limit the invention to the precise form disclosed. Other modifications or variations are possible in light of the above teachings.

The embodiments were chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of fabricating a memory device comprising:
   providing a dielectric layer;
   providing an opening in the dielectric layer;
   providing a first conductive body in the opening;
   providing a switching body in the opening; and
   providing a second conductive body in the opening wherein a conductive glue is formed above the second conductive body.

2. The method of claim 1 wherein the switching body contacts the first conductive body, and the second conductive body contacts the switching body.

3. The method of claim 1 and further comprising providing a third conductive body in the opening.

4. The method of claim 3 wherein the third conductive body contacts the second conductive body.

5. The method of claim 4 and further comprising said memory device incorporated in a system.

6. The method of claim 5 wherein the system is selected from the group consisting of a hand-held device, a vehicle, and a computer.

7. A method of fabricating a memory device comprising:
   providing a first dielectric layer;
   providing an opening in the first dielectric layer;
   providing a first conductive body in the opening in the first dielectric layer;
   providing a second dielectric layer;
   providing an opening in the second dielectric layer;
   providing a switching body in the opening in the second dielectric layer; and
   providing a second conductive body in the opening in the second dielectric layer wherein a conductive glue is formed above the second conductive body.

8. The method of claim 7 wherein the switching body contacts the first conductive body, and the second conductive body contacts the switching body.

9. A method of fabricating a memory device comprising:
   providing a dielectric layer;
   providing an opening in the dielectric layer;
   providing a first conductive layer on the dielectric layer and in the opening;
   providing a layer of switching material on the first conductive layer and in the opening;
   providing a second conductive layer on the layer of switching material and in the opening wherein a conductive glue is formed above the second conductive layer; and
   removing portions of the first conductive layer, layer of switching material and second conductive layer from over the dielectric layer so that remaining portions of the first conductive layer, layer of switching material and second conductive layer are within the opening.

10. The method of claim 9 and further comprising providing a third conductive layer on the second conductive layer, and removing portions of the first conductive layer, layer of switching material, second conductive layer and third conductive layer from over the dielectric layer so that remaining portions of the first conductive layer, layer of switching material, second conductive layer and third conductive layer are within the opening.

11. The method of claim 10 and further comprising providing an additional dielectric layer over the resulting structure, providing an opening in the additional dielectric layer, and providing an additional conductive layer on the additional dielectric layer and in the opening of the additional dielectric layer and contacting the portion of the third conductive layer in the opening in the first-mentioned dielectric layer.

12. The method of claim 9 and further comprising providing an additional dielectric layer over the resulting structure, providing an opening in the additional dielectric layer, and providing an additional conductive layer on the additional dielectric layer and in the opening of the additional dielectric layer and contacting the portion of the second conductive layer in the opening in the first-mentioned dielectric layer.

13. A method of fabricating a memory device comprising:
    providing a first dielectric layer;
    providing an opening in the first dielectric layer;
    providing a first conductive layer on the first dielectric layer and in the opening in the first dielectric layer;
    removing portions of the first conductive layer from over the first dielectric layer so that a remaining portion of the first conductive layer is within the opening in the first dielectric layer;
    providing a second dielectric layer on the first dielectric layer;
    providing an opening in the second dielectric layer;
    providing a layer of switching material on the second dielectric layer and in the opening in the second dielectric layer and on the remaining portion of the first conductive layer;
    providing a second conductive layer on the layer of switching material and in the opening in the second dielectric layer wherein a conductive glue is formed above the second conductive layer; and
    removing portions of the layer of switching material and second conductive layer from over the second dielectric layer so that remaining portions of the layer of switching material and second conductive layer are within the opening in the second dielectric layer.

14. The method of claim 13 and further comprising providing an additional dielectric layer over the resulting structure, providing an opening in the additional dielectric layer, and providing an additional conductive layer on the additional dielectric layer and in the opening of the additional dielectric layer and contacting the portion of the second conductive layer in the opening in the second dielectric layer.

15. A memory device comprising;
    a dielectric layer having an opening;
    a first conductive layer in the opening;
    a layer of switching material in the opening and on the first conductive layer; and a second conductive layer in the opening and on the layer of switching material wherein a conductive glue is formed above the second conductive layer.

16. The memory device of claim 15 and further comprising a third conductive layer in the opening and on the second conductive layer.

17. The memory device of claim 16 and further comprising an additional dielectric layer on the first-mentioned dielectric layer and having an opening, and an additional conductive layer on the additional dielectric layer and in the opening of the additional dielectric layer and contacting the third conductive layer in the opening in the first dielectric layer.

18. The memory device of claim 15 and further comprising an additional dielectric layer on the first-mentioned dielectric layer and having an opening, and an additional conductive layer on the additional dielectric layer and in the opening of the additional dielectric layer and contacting the second conductive layer in the opening in the first dielectric layer.

19. A memory device comprising;
    a first dielectric layer having a opening therein;
    a first conductive layer in the opening of the first dielectric layer;
    a second dielectric layer on the first dielectric layer and having an opening therein;
    a layer of switching material in the opening of the second dielectric layer and on the first conductive layer; and
    a second conductive layer in the opening of the second dielectric layer and on the layer of switching material wherein a conductive glue is formed above the second conductive layer.

20. The memory device of claim 19 and further comprising an additional dielectric layer on the second dielectric layer and having an opening, and an additional conductive layer on the additional dielectric layer and in the opening of the additional dielectric layer and contacting the second conductive layer in the opening in the second dielectric layer.

* * * * *